(12) United States Patent
Riedl et al.

(10) Patent No.: US 8,147,621 B2
(45) Date of Patent: Apr. 3, 2012

(54) METHOD FOR PRODUCING A METAL ARTICLE INTENDED FOR AT LEAST PARTIALLY COATING WITH A SUBSTANCE

(75) Inventors: Edmund Riedl, Gebelkofen (DE); Wolfgang Schober, Amberg (DE)

(73) Assignee: Infineon Technologies AG, Neubiberg (DE)

( * ) Notice: Subject to any disclaimer, the term of this patent is extended or adjusted under 35 U.S.C. 154(b) by 233 days.

(21) Appl. No.: 12/107,374

(22) Filed: Apr. 22, 2008

(65) Prior Publication Data

US 2008/0194063 A1  Aug. 14, 2008

Related U.S. Application Data

(60) Division of application No. 10/986,372, filed on Nov. 12, 2004, now Pat. No. 7,384,698, which is a continuation of application No. PCT/DE03/01529, filed on May 12, 2003.

(30) Foreign Application Priority Data

May 14, 2002  (DE) .................. 102 21 503

(51) Int. Cl.
  C23C 8/00   (2006.01)
  C23C 8/10   (2006.01)
  C23C 8/34   (2006.01)
  C22F 3/00   (2006.01)

(52) U.S. Cl. ........ 148/240; 148/277; 148/284; 428/612; 428/687; 428/304.4; 427/245

(58) Field of Classification Search .......... 148/240, 148/277, 284; 427/245; 428/612, 687, 304.4
See application file for complete search history.

(56) References Cited

U.S. PATENT DOCUMENTS

| | | | |
|---|---|---|---|
| 2,354,163 A * | 7/1944 | Weizmann et al. | 427/337 |
| 3,016,293 A | 1/1962 | Cybriwsky et al. | |
| 4,465,580 A | 8/1984 | Kasuya | |
| 4,918,248 A * | 4/1990 | Hattori et al. | 568/885 |
| 4,977,038 A | 12/1990 | Sieradzki et al. | |
| 4,997,516 A | 3/1991 | Adler | |
| 5,122,858 A | 6/1992 | Mahulikar et al. | |
| 5,298,337 A | 3/1994 | Hendricks | |
| 5,629,835 A | 5/1997 | Mahulikar et al. | |

(Continued)

FOREIGN PATENT DOCUMENTS

DE  870821  3/1953

(Continued)

OTHER PUBLICATIONS

International Search Report WO/2003/096389, Riedl, et al., 5 pages, Nov. 28, 2003.

*Primary Examiner* — Roy King
*Assistant Examiner* — Lois Zheng
(74) *Attorney, Agent, or Firm* — Edell, Shapiro & Finnan, LLC

(57) ABSTRACT

A method of producing a metal article intended for at least partially coating with a substance, which includes a metal solder, a plastic, a glass, or a ceramic. The metal article itself may include, in particular, connecting, supporting, or conducting components for an electronic component. The metal article has macroscopically smooth surface portions and a plurality of multiply curved nanopores in the region of at least one surface portion.

18 Claims, 6 Drawing Sheets

U.S. PATENT DOCUMENTS

| | | |
|---|---|---|
| 5,731,634 A | 3/1998 | Matsuo et al. |
| 6,284,309 B1 | 9/2001 | Bishop et al. |
| 6,329,899 B1 | 12/2001 | Hunt et al. |
| 6,602,653 B1 | 8/2003 | Geusic et al. |
| 2001/0050265 A1 | 12/2001 | Cohen et al. |

FOREIGN PATENT DOCUMENTS

| | | |
|---|---|---|
| EP | 0687008 A2 | 12/1995 |
| EP | 0881678 A2 | 12/1998 |
| EP | 0964076 B1 | 12/1999 |
| JP | 60177198 | * 9/1985 |

* cited by examiner

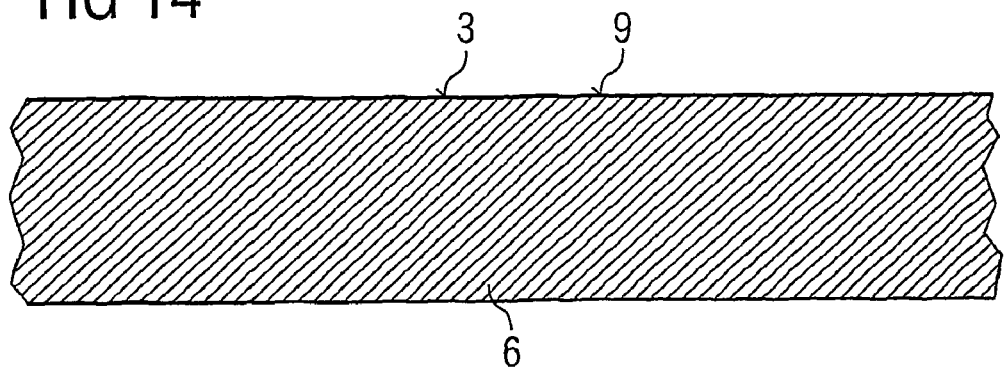
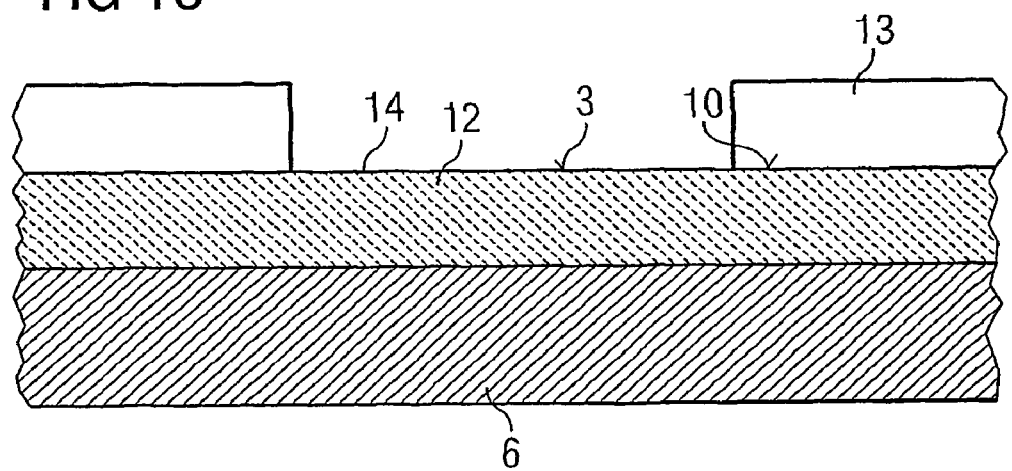
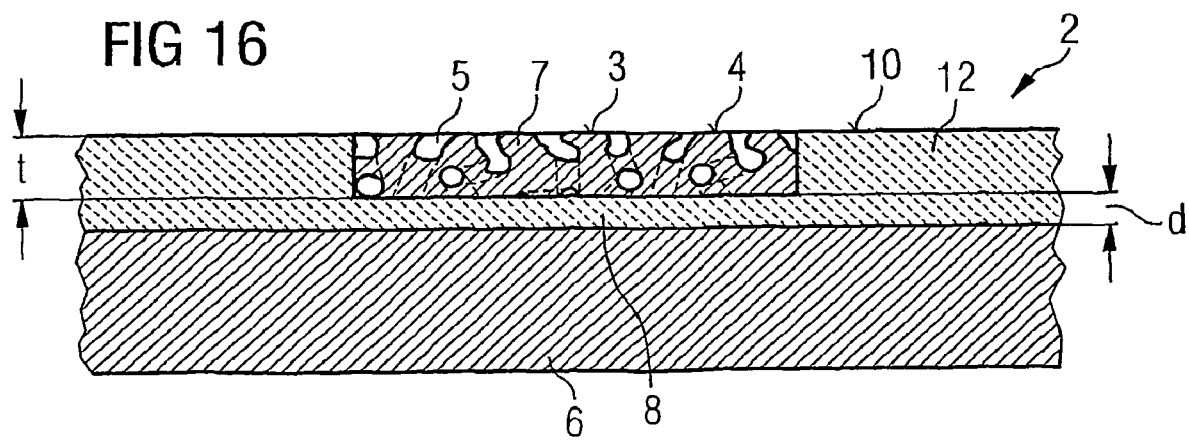

METHOD FOR PRODUCING A METAL ARTICLE INTENDED FOR AT LEAST PARTIALLY COATING WITH A SUBSTANCE

CROSS REFERENCE TO RELATED APPLICATIONS

This application is a divisional of U.S. patent application Ser. No. 10/986,372 filed Nov. 12, 2004, entitled "Metal Article Intended for at Least Partially Coating with a Substance and a Method for Producing the Same," which was a continuation of PCT/DE03/01529, filed May 12, 2003, and titled "Metal Article Intended for at Least Partially Coating with a Substance," which claims priority under 35 U.S.C. §119 to German Application No. DE 102 21 503.0, filed on May 14, 2002, and titled "Metal Article Intended for at Least Partially Coating with a Substance," the entire contents of each are hereby incorporated by reference.

FIELD OF THE INVENTION

The invention relates to a method for producing a metal article intended for at least partially coating with a substance and to a method for producing components.

BACKGROUND

If metal articles, in particular, connecting, supporting, or conducting components for an electronic component, are to be coated on their macroscopically smooth surfaces with a substance, in particular, plastic, ceramic, or glass, adhesion promoters are electrodeposited on the macroscopically smooth surfaces of the metal articles. Dendrites form and consequently provide an interlocking bond between the metal article and the substance. These electrodeposited adhesion layers form two further boundary layers or phase transitions, i.e., a boundary layer between the smooth unchanged metal surface and the dendritic adhesion layer and a further boundary layer between the dendritic adhesion layer and the substance to be applied.

In addition, with this preparation of the metal surface, the adhesion layer is applied with the aid of a wet process, and consequently, contaminations by components of the electrolytic bath are unavoidable. Such contaminations can reduce the service life of the adhesion layers, and consequently, reduce the service life of the electronic components.

Macroscopically smooth surfaces of metal articles are understood to mean surfaces which have at least a polished quality. Metal articles with polished surfaces of this type are used, in particular, in electronic components as connecting, supporting, or conducting components, with further precious metal layers frequently being deposited on the polished surfaces in order to produce bonded connections and soldered connections on them.

By applying adhesion layers to the macroscopically smooth surface or by roughening the macroscopically smooth surfaces by mechanically or by etching means, these macroscopically smooth surfaces are transformed into rough surfaces that are partially strewn with dendrites of the adhesion promoter, grinding pits, or etching pits, respectively. The macroscopically smooth surface regions that are intended to represent contact terminal areas, bonding fingers, or other components must be protected from roughening with covering processes.

A metal article intended for at least partial connection to a substance without additional adhesion-promoting materials, to permit mechanical connecting of its surface to a further substance is desirable. At the same time, the macroscopically smooth surface of the metal article is retained. To simplify connecting macroscopically planar surfaces of metallic articles to a substance and to provide mechanically stable phase transitions is desirable.

SUMMARY

According to the invention, a metal article intended for at least partially coating with a substance, in particular, connecting, supporting, or conducting components for an electronic component, with macroscopically smooth surface portions is provided. In this case, a plurality of open nanopores, which are multiply curved and open out on the surface portion concerned, are provided in one region of at least one surface portion. Microscopically small nanopores of this type promote the mechanical connecting of the metal article to a substance, but the surface portion or the entire surface of the metal article remains macroscopically smooth and planar. Microscopically small is understood to mean dimensions which can only be detected and measured under an electron microscope.

With such a metal article, desired substances, in particular, glass, ceramic, and plastic, can be anchored in the nanopores. This anchoring takes place three-dimensionally due to the multiple curvature of the nanopores, and consequently, relatively reliable adhesion and positive connection of the substance on the metal article are ensured. In addition, a macroscopically smooth surface is retained in spite of the nanopores. As a result, finishing or coating of the surface portions, i.e., bonding, soldering, and other techniques in which smooth surfaces of a metal article are a precondition, remains possible.

In a method for producing the nanopores, the metal surface is initially oxidized and subsequently the metal oxide layer created is reduced. As a result, the material in the region of the surface portion with nanopores is relatively identical to the material of the metal article. Furthermore, both the oxidation and the reduction of the metal article can be carried out in dry processes. There is no contamination by foreign substances remaining in the nanopores. This results in the formation of high-purity metallic surfaces, which can be mechanically connected directly to the substance to be applied.

A reduction of the metal oxide layer may be set to create a metal article for at least partially coating with a substance, which has a buried metal oxide layer. In this case, the metal article has a solid metal core, which has at least one porous macroscopically planar metal layer region in the region of at least one surface portion. In this case, the metal layer region includes the material of the metal core and exhibits multiply curved open nanopores. These nanopores open out at the surface of the metal layer region. A pore-free buried layer of metal oxide is arranged between the metal layer region with nanopores and the solid metal core.

This three-layer formation includes metal imbued with nanopores, pore-free metal oxide, and a pore-free metal core. The buried layer of metal oxide forms an electrically isolating layer. As a result that, when electrically conducting substances are applied, the electrically conducting substances are electrically isolated from the metal core of the metal article.

In another embodiment of the invention, the surface portion with nanopores may be arranged alongside a pore-free metal surface. Structures and geometries of this type are possible if the oxidation process and reduction process are restricted to the surface portions of the metal article to be mechanically connected to a substance. Instead of a pore-free metal surface, the surface portion with nanopores may also be surrounded by a pore-free metal oxide area. For this embodiment of the metal article, the entire surface is initially oxidized and is reduced at the surface portions on which nanopores are to be formed. If this reduction is carried out down as far as the metal core, individual islands or surface portions of the metal article, which can be intensively connected to a substance are obtained, while the surrounding areas can shift in a sliding manner with respect to the surrounding substance. As a result, for example, thermal stress can be relieved. Furthermore, a surface structure of this type is particularly suitable for producing external contact areas with nanopores and surrounding solder resist areas, which dispenses with the need to apply layers of solder resist and to provide external contact areas that have been improved in their adhering and connecting properties.

The metal article can improve contact vias of metal. The contact vias lead through glass, ceramic, or plastic. For this purpose, the contact via of metal, i.e., in the form of flat conductors or conduction wires, may have a surface portion with a multiplicity of open nanopores, which are multiply curved and open out on the surface portion concerned, in its region of through-contact. In the case of the contact via, these nanopores are filled with the substance to be connected, such as glass, ceramic, or plastic. As a result, in spite of macroscopically smooth surface regions of the metallic contact via, the substance is interlocked with the substance to be connected.

In another embodiment of the invention, a contact via as a metal article includes copper or a copper alloy. Copper or copper alloys are, for instance, used in contact vias that are mechanically connected to glass, ceramic, or plastic, since they have a low electrical resistance. However, the coefficient of thermal expansion of copper or copper alloys cannot be adapted at will to the substance. As a result, in further embodiments of the invention, metal articles of chromium/nickel/iron alloys are also used as contact vias, especially because, depending on the composition, i.e., nickel-iron alloys, in particular, can be adapted to different coefficients of expansion of the substances.

In a further embodiment of the invention, a number of metal articles, such as flat conductor ends, inner flat conductors, or chip islands on which semiconductor chips are arranged, are connected to a plastic package molding compound of an electronic component. For this purpose, the metal articles have macroscopically smooth surface portions, a multiplicity of open nanopores which are multiply curved, open out on the surface portion concerned, and are filled with plastic package molding compound, which is to be mechanically connected to the metal articles being provided in the region of at least one surface portion.

An electronic component has metallic articles or metal components do not have to be coated with an additional adhesion-promoter layer or adhesion layer. As a result, additional material that could reduce the service life of the component is not introduced into the overall construction. Rather, the metals that are required for the metal articles are used and are connected directly to the plastic package molding compound without any further additions.

The metal article can also be used in electronic components with a plastic package and a semiconductor chip which has metallic conductor tracks. The semiconductor chip is closed off on its active upper side from external influences by a passivation layer of ceramic. This ceramic layer lies partially on smooth, metallic conductor tracks. The ceramic layer has silicon nitride in particular. In order to anchor this ceramic layer of silicon nitride on the macroscopically smooth surface portions of the conductor tracks, a multiplicity of open nanopores, which are multiply curved and open out on the surface portion of the conductor track, may be provided in the region of at least one of the surface portions. In the case of this embodiment of the invention, the nanopores are filled with ceramic compound and the conductor tracks and the ceramic compound are consequently mechanically connected intimately to one another.

The metallic article according to the invention can be used for metallic chip islands. These chip islands have macroscopically smooth surface portions to which the semiconductor chip is to be electrically connected. For this purpose, a conductive adhesive is used between the semiconductor chip and the macroscopically smooth surface of the chip island. The mechanical connection between the conductive adhesive and the chip island can be intensified, if a multiplicity of open nanopores, which are multiply curved and open out on the surface portion concerned, are provided. In this way, apart from its electrical connection, the conductive adhesive is then also mechanically connected to the metallic chip island because the conductive adhesive fills the curved nanopores.

When connecting patterned metal foils as an intermediate layer between two substances that are mechanically connected, for example, ceramic and plastic, which each have a different coefficient of thermal expansion, problems can occur. The substances can become delaminated from the patterned metal foils. Delamination of the substances from the patterned metal foils can be prevented, if the metal foil has on both sides macroscopically smooth surface portions which have in one surface portion a multiplicity of open nanopores which are multiply curved and open out on the surface portion concerned. These nanopores are then respectively filled with the material of one of the substances to be mechanically connected by the metal foil. Consequently, delamination of a laminate of this type, which has different substances with patterned metal foil lying in between, can be prevented.

The nanopores in a metal article of this type have an average diameter D of 10 nm to 300 nm. The average density of the nanopores on the surface of the metal article is dimensioned such that the macroscopically smooth surface is not disturbed by the nanopores and also not made to bow or collapse. Depending on the metal oxide prepared, the depth of the nanopores lies between 0.1 micrometers and 10 micrometers. If a pore-free buried layer of metal oxide is provided, its thickness d may lie between 0.1 micrometers and 3 micrometers.

A method for producing a metal article for at least partial mechanical connection to a substance can include, partially oxidizing the metal article, forming a metal oxide layer on a surface portion of the metal article, reducing of the metal oxide layer to a porous structure with open nanopores which are multiply curved and open out from the surface portion. Based on heterogeneous kinetics in the oxide layer reduction, a recreated metal surface with a corresponding nanometer porosity is left behind. This structure is formed as a sponge structure on the surface of the metal article, since the molar volume of the metal oxides after oxidation is generally greater than that of the corresponding metals.

The dimensions and the number of pores can be freely set by the parameters, i.e., oxidation rate, oxide thickness, reduction rate, and by cyclical oxidizing and reducing and renewed oxidizing and reducing. In this case, the system parameters, such as the oxidation/reduction temperature and the oxidation/reduction time as well as the partial pressure of the oxygen component of the oxidizing atmosphere, in the oxidation step can be varied. Similarly, the partial pressure of the reducing medium in the reduction step can be varied. However, nanopores can only be stably produced on those metals which also form stable oxides, i.e., the oxides do not evaporate. Furthermore, these oxides must be reducible at a temperature below the melting temperature of the metals with a reducing medium such as hydrogen. Consequently, copper and copper alloys as well as nickel/chromium/iron alloys can be used, in particular.

In an exemplary embodiment of the method, the reduction of the metal oxide layer may not take place completely. As a result, a buried metal oxide layer remains as an intermediate layer on the surface of the metal article. The reduction of the metal oxide layer may also be restricted to certain surface portions, with the result that the surface portion. As a result, the surface portion of metal with metal with nanopores is surrounded by a pore-free metal oxide layer. In order to restrict a reduction of the overall oxide layer to certain surface portions, a protective layer is applied to the areas, which are not to be reduced.

In a further example of the method, oxidizing occurs in an oxygen-containing dry atmosphere with an oxygen content of 20 to 100% by volume. The oxidation temperature depends on the type of metal article. In a dry oxidation process, very dense, but slowly growing layers are formed. A dry oxidation of this type ensures that the regions later reduced form a coherent metal skeleton, which macroscopically has a smooth surface.

The oxidation of the metal surface may also be carried out in a wet, oxygen-containing atmosphere. The relative humidity is between 60 and 95% and the oxygen content 20 to 98% by volume. Wet oxidation proceeds more rapidly than dry oxidation, since the water molecules are significantly smaller than the oxygen molecules. Consequently, the diffusion rate of oxygen molecules through oxide layers that have already formed is relatively greater than in dry oxidation. While dry oxidation for a copper article or an article of a copper alloy at temperatures between 300 and 600° C. for 10 to 20 minutes, a lower temperature range between 300 and 500° C. is adequate for wet oxidation. The oxidation process of wet oxidation of copper or copper alloy takes approximately between 5 and 10 minutes.

With the lower temperature range of the wet oxidation, the oxidation of the metal surfaces of an electronic component can also take place after a semiconductor chip is applied to the chip island and after the wire bonding of the semiconductor chip to the corresponding inner flat conductor ends. For this purpose, the semiconductor chip withstands the thermal loading, but is not contaminated by additional chemicals, as when adhesion layers are applied by electrodeposition. Consequently, following mounting of a semiconductor chip on a flat conductor frame and completion of the electrical connections, the exposed surface portions of the various metal components can be provided with nanopores by oxidation and reduction. As a result that an intensive connection to a plastic package molding compound that is subsequently to be applied can be established.

The reaction temperature or oxidation temperature in the case of metal articles of chromium/nickel/iron alloys is at temperatures between 500 and 900° C. This means that relatively higher oxidation temperatures are used for metal articles of this type, than with copper alloys. Wires of this type of metal alloys are used, however, for contact vias through, for example, glasses and ceramics, since their coefficient of thermal expansion can be adapted to the coefficients of thermal expansion of glasses and ceramics. Mechanical anchoring with and connection to the glasses and ceramics is no longer a problem.

In the oxidation, an oxide layer between 0.1 and 10 micrometers thick is grown on the metal article. As already mentioned above, this thickness can be specifically set by the oxidation parameters of temperature and time and by the oxidation atmosphere as well as by the choice of a suitable metal material. Consequently, the depths of the different nanopores can at the same time be defined in advance with this oxide layer thickness.

In a further example of the method, reduction is in a hydrogen-containing atmosphere. The temperature of the reduction is between 300 and 500° C. for copper oxide layers. In the case of oxide layers based on chromium/nickel/iron alloys, the reduction temperatures are correspondingly higher. Diamine, forming gas, hydrazine, and/or formaldehyde may be used as hydrogen-containing components in the reduction atmosphere. Furthermore, an enlargement and deepening of the nanopores can be achieved by repeated oxidation and reduction.

Electronic components produced by the method according to the invention can include at least partially oxidizing metallic components of the electronic component to be packaged in a plastic package molding compound. After oxidation, these partially oxidized metallic components are reduced, forming multiply curved nanopores which open out from corresponding reduced surface portions of the components. The material of the package, such as the plastic package molding compound, can penetrate into these open pores and relatively firmly anchor with the mechanical components. As a result, the electronic component has an increased service life.

For producing an electronic component with a semiconductor chip, the semiconductor chip may be specially prepared by the method according to the invention, in order to apply a passivation layer to the active surface of the semiconductor chip in a moisture-resistant manner. For this purpose, the metallic conductor tracks on the active upper side of the semiconductor chip are at least partially oxidized and these partially oxidized metallic conductor tracks are subsequently reduced, forming multiply curved nanopores. The nanopores open out from correspondingly reduced surface portions of the conductor tracks. Subsequently, the passivation layer of polyimide, silicon carbide, silicon dioxide or silicon nitride is introduced into the open nanopores. As a result, the areas of the semiconductor chip having conductor tracks are protected by these nanopores being filled with the material of the passivation layer. The risk of delamination of the passivation layer from the active upper side of the semiconductor chip for electronic components of this type is reduced.

The adhesion of polymers on macroscopically smooth metal surfaces is a chemical bond between the metal oxides present on the metal surfaces and a functional group of the organic molecule of the polymer. However, these bonding forces are relatively weak and are based on a van der Waals interaction. Consequently, the adhesion on pure and smoothly polished metal surfaces is extremely poor. Great adhesion is achieved, however, by a rough surface structure, which is realized with the aid of electrodeposited adhesion layers. However, adhesion layers of this type introduce impurities and contaminations into the overall microstructure, which can reduce the service life of electronic components, in particular, semiconductor chips.

The metal article according to the invention has metal surfaces with pores on the nanometer scale. For this purpose, the corresponding metal is first thermally oxidized to an oxide thickness of between 0.1 and 10 micrometers, for instance, between 1 and 5 micrometers. Subsequently, the metal oxide present is thermally reduced in the mixture of nitrogen and hydrogen, such as a forming gas which contains 5% hydrogen. Based on heterogeneous kinetics in the oxide layer reduction, the recreated metal surface with a corresponding nanometer porosity is left behind. This metal structure presents itself as if it were as a sponge structure on the surface of the substrate, because the molar volume of the metal oxides is generally greater than that of the corresponding metals.

The dimensions and the number of pores can be freely set by the parameters, i.e., oxidation rate, oxide thickness, reduction rate, and by cyclical oxidizing-reducing-oxidizing-reducing. In this case, the system parameters, such as the oxidation/reduction temperature and time as well as the partial pressure of oxygen in the oxidation step and the partial pressure of hydrogen in the reduction step are used to achieve a predetermined oxidation thickness, and consequently a predetermined pore depth of the nanopores. In principle, metals which form stable oxides and oxides which can be reduced below the melting temperature of the metals with hydrogen can be used for this process.

By this measure, adhesion-promoting surfaces are generated without applying or depositing foreign substances. This eliminates contamination of the substrate with foreign substances, which increases the service life of the components. For components, the possibility of treatment both before the chip bonding and wire bonding and the possibility of generating the adhesion-promoting layer with nanopores after the chip/wire bonding is provided. The chip withstands the thermal treatment required in oxidation and reduction. However, the chip is not exposed to chemicals as in conventionally applied adhesion layers. The structure formed in this way includes exclusively the metal of the metal article. Consequently, there is no further boundary surface between the metal article and the adhesion-promoting structure with nanopores. Although no additional substance in the form of an adhesion layer is introduced into the system when roughening a metal surface by mechanical or etching means either, the macroscopically smooth surface is lost in the process, and no anchoring structures in the form of multiply curved nanopores are formed.

BRIEF DESCRIPTION OF THE DRAWINGS

The invention is now explained in more detail on the basis of embodiments with reference to the accompanying figures, where:

FIGS. 14 to 16 show schematic cross sections through part of a metal article after method steps for producing an isolated surface portion with nanopores in a metal matrix.

DETAILED DESCRIPTION

Figure 1:
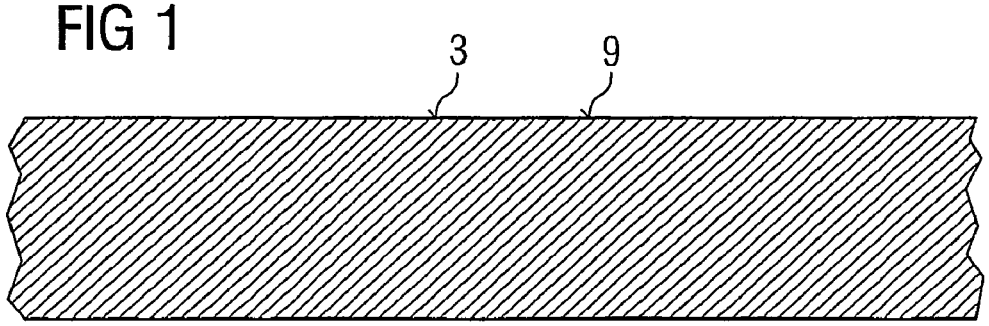
FIG. 1 shows a schematic cross section through part of a metal article.

FIG. 1 shows a schematic cross section through part of a metal article. This metal article has a macroscopically smooth surface 3, which forms a still pore-free metal surface 9.

Figure 2:
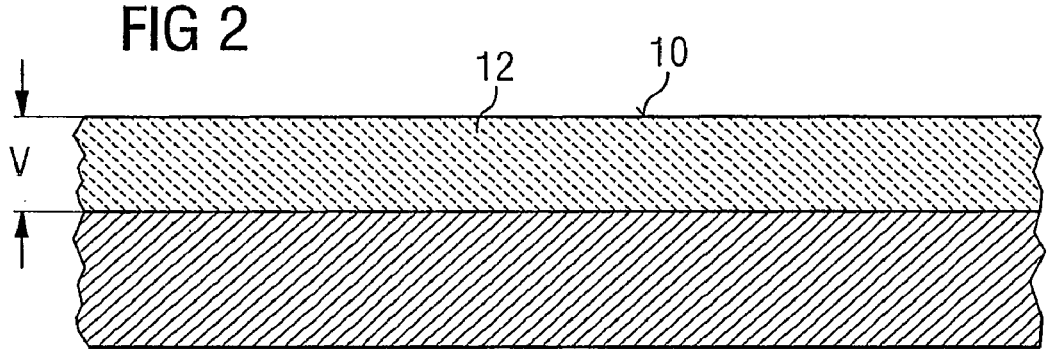
FIG. 2 shows a schematic cross section through part of a metal article after oxidation of its surface.

FIG. 2 shows a schematic cross section through part of a metal article after oxidation of its surface. This creates a metal oxide layer 12 with a pore-free metal oxide surface 10, which covers the surface of the illustrated part of the metal article. The thickness V of the metal oxide layer is relatively greater than the depth of the amount of metal of the pore-free metal surface 9 consumed in the oxidation, as is shown in FIG. 1, since the molar volume of the metal oxide is generally greater than that of the corresponding metal. The oxidation is achieved by the metal article being placed in an oxidation oven with an oxygen content of between 20 and 100% by volume. The article is able to oxidize in air at correspondingly high temperatures.

The oxidation temperature in the oxidation oven for a metal article of copper or a copper alloy is set between 300 and 600° C. for 5 to 20 minutes. In this case, the higher temperature and the longer time are required for dry oxidation, and the shorter time and the lower temperature can be achieved by wet oxidation. For wet oxidation, the reaction atmosphere is operated with a relative humidity of between 60 and 95% and with temperatures between 300 and 500° C.

The thickness V of the oxide layer lies between 0.1 and 10 micrometers and can be accurately controlled by setting the oxidation parameters.

Figure 3:
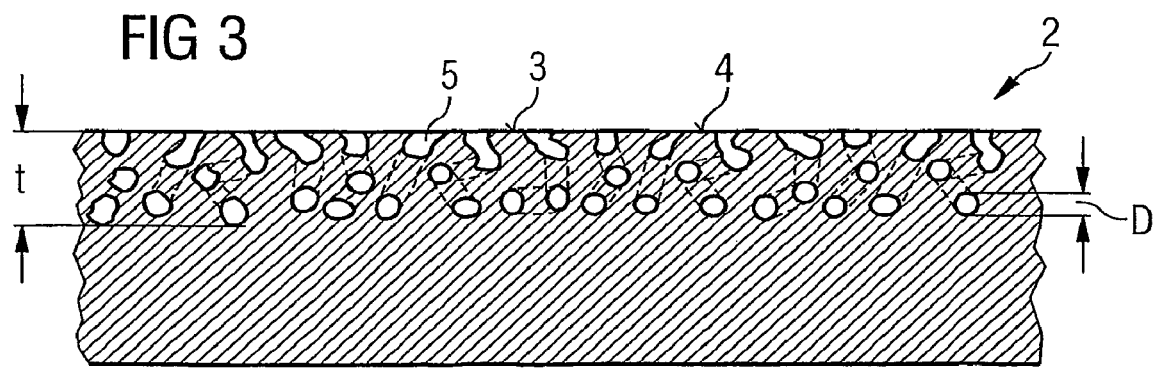
FIG. 3 shows a schematic cross section through part of a metal article after reduction of the metal oxide to metal with nanopores in the metal microstructure.

FIG. 3 shows a schematic cross section through part of a metal article after reduction of the metal oxide layer 12 to metal with nanopores in the metal microstructure. The heterogeneous kinetics in this oxidation layer reduction has the effect that the recreated metal surface with a corresponding porosity of nanopores is left behind. In this case, the nanopores are open toward the upper side. The diameter of the nanopores D lies between 10 and 300 nanometers. The limit or depth t of the nanopores is determined by the depth V of the metal oxide layer 12 that is shown in FIG. 2. Complete reduction of the metal oxide layer 12 shown in FIG. 2 achieves a macroscopically smooth surface 3 of metal with nanopores 5, which extend as far as the surface and have a depth of t. The reduction itself is carried out in a reducing atmosphere of 300 to 500° C. for the reduction of copper or copper alloys. Hydrogen-containing components are used for the reduction. In this case, forming gas with a 5% oxygen content can be used, or diamine, a compound between nitrogen and hydrogen. Furthermore, it is possible also to use hydrazine or formaldehyde for the hydrogen reduction in a corresponding reduction oven.

Figure 4:
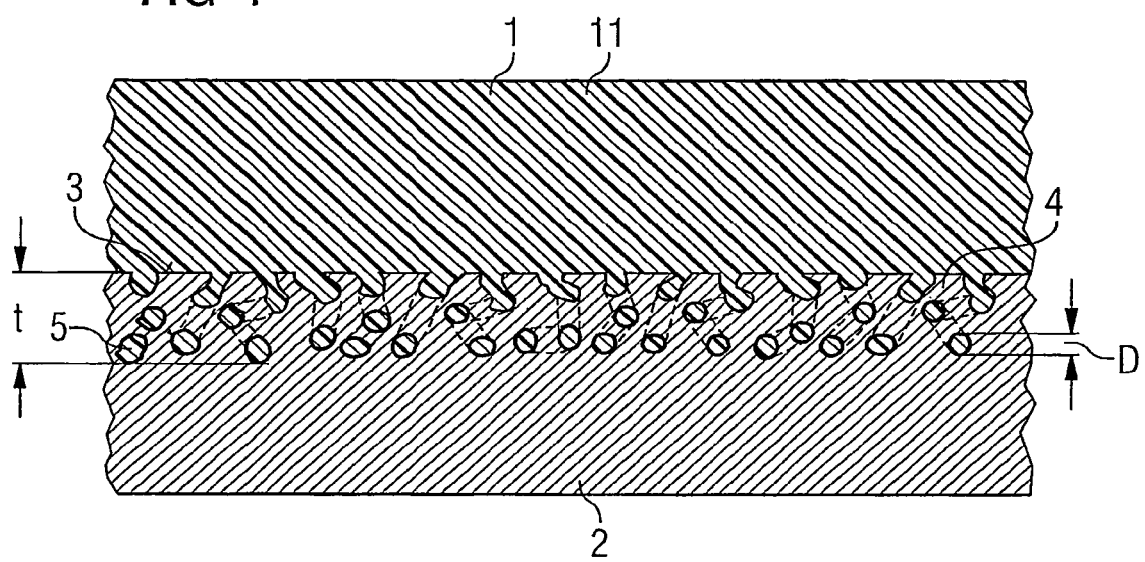
FIG. 4 shows a schematic cross section through part of a metal article mechanically connected to a substance.

FIG. 4 shows a schematic cross section through part of a metal article connected to a substance. Metal articles of this type are preferably components of an electronic component which includes a semiconductor chip. In this case, the metal article 2 represented here illustrates the inner end of a flat conductor of an electronic component and the substance 1 is, in this example of FIG. 4, a plastic package molding compound, into which the flat conductor and other metallic components of the electronic component, such as bonding wires and chip islands, are embedded. The nanopores 5 in the surface of the metal article 2 achieve the effect of an intimate positive interlocking bond, while retaining a macroscopically smooth surface 3 of the metal article 2. Furthermore, no chemicals are required to realize this bond.

Instead of a plastic package molding compound, a silicon nitride, a polyimide layer, or a silicon dioxide layer may be deposited, for example, as the substance 1 on conductor tracks as the metal article 2 of a semiconductor chip, if the surface for receiving the material of a passivation layer by oxidation and reduction of these conductor tracks has been prepared in advance.

Figure 5:
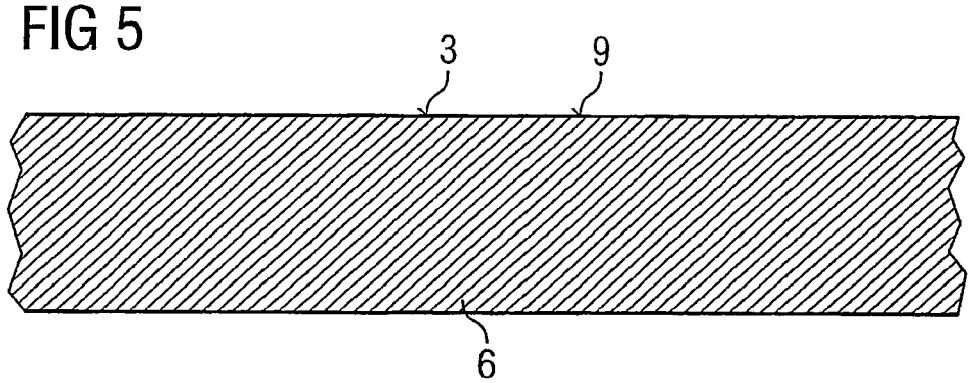
FIGS. 5 to 7 show schematic cross sections through part of a metal article after method steps for producing a metal article with a buried oxide layer.
Figure 6:
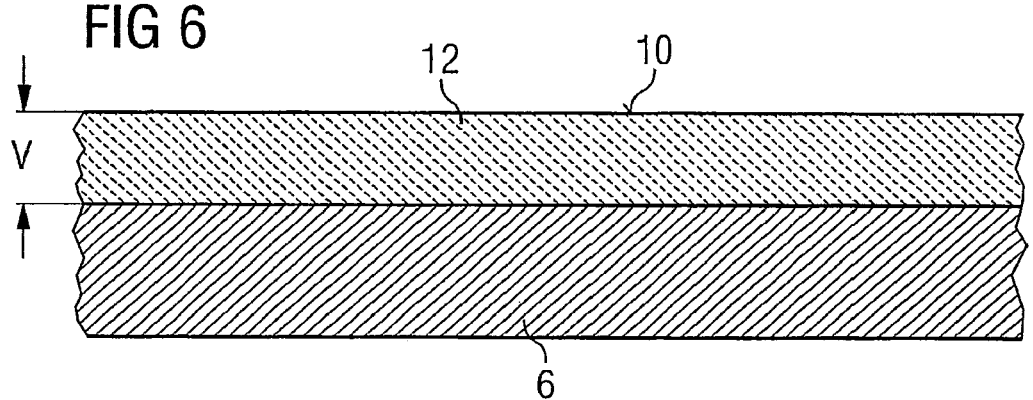
Figure 7:
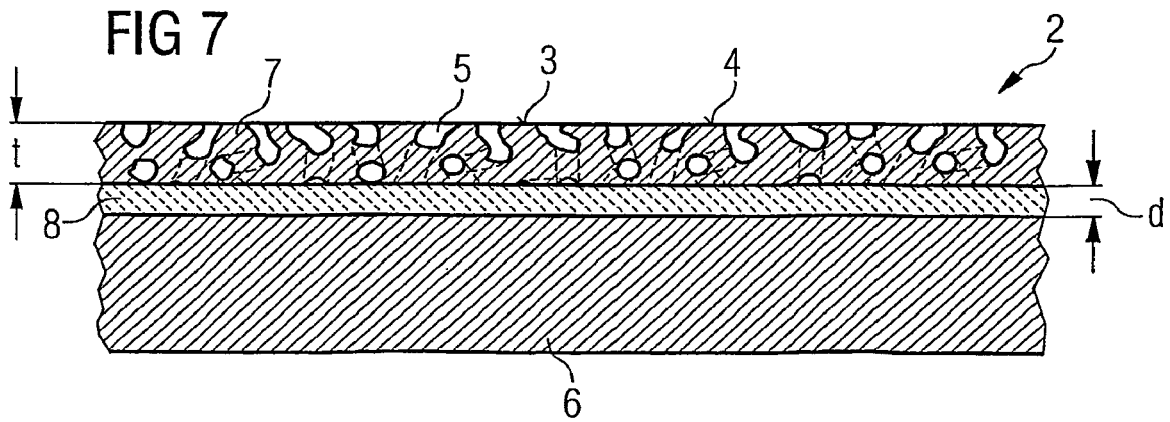

FIGS. 5 to 7 show schematic cross sections through part of a metal article 2 after method steps for producing a metal article 2 with a buried metal oxide layer 8. In the case of this production method, the same procedure as in the FIGS. 1 to 3 is followed, but the reduction is ended earlier than would be required for a complete reduction of the metal oxide layer 12, as shown in FIG. 6. This allows the formation of a buried oxide layer 8, as shown in FIG. 7, which has an isolating effect and is suitable in particular when conductor tracks of a semiconductor chip are provided with a passivation layer of ceramic or polyimide.

FIG. 5 again shows a schematic cross section through part of a metal article. This metal article has a macroscopically smooth surface 3, which forms a pore-free metal surface 9.

FIG. 6 again shows a schematic cross section through part of a metal article after oxidation of its surface. In this case, a metal oxide layer 12 which covers a pore-free metal core 6 is created.

FIG. 7 shows a schematic cross section through the metal article after incomplete reduction of the metal oxide layer 12 shown in FIG. 6. In this case, three layer regions are formed. First, a metal layer region 7 with nanopores 5 includes the same material as the solid metal core 6, while the buried metal oxide layer 8 is arranged between the metal core 6 and the metal layer region 7 and has a thickness d. The thickness d can be set by setting the duration and the temperature of the reduction phase.

Figure 8:
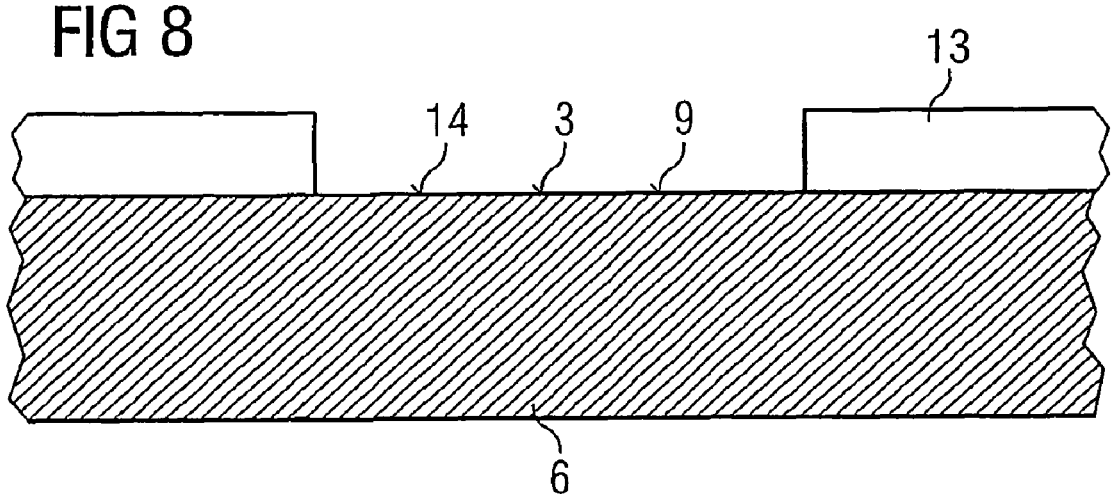
FIGS. 8 to 10 show schematic cross sections through part of a metal article after method steps for producing a surface portion with nanopores.
Figure 9:
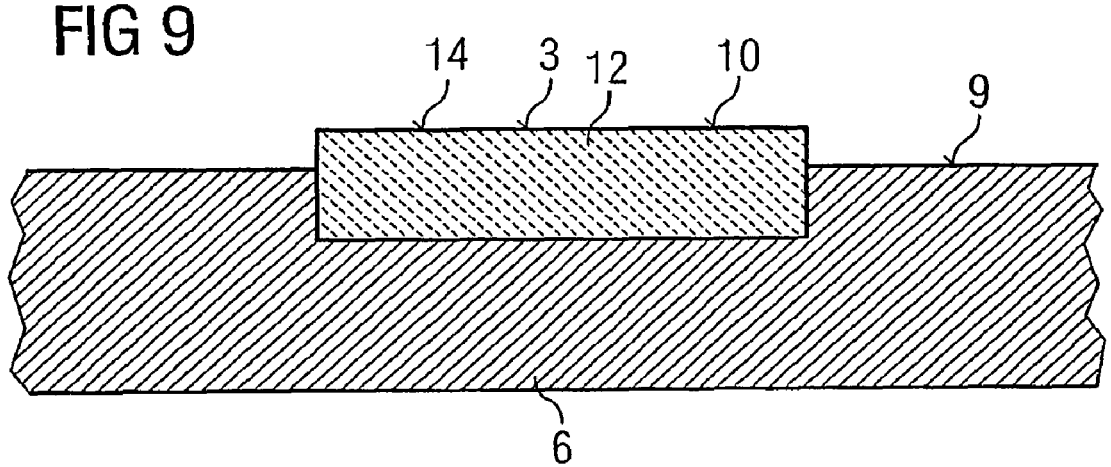
Figure 10:
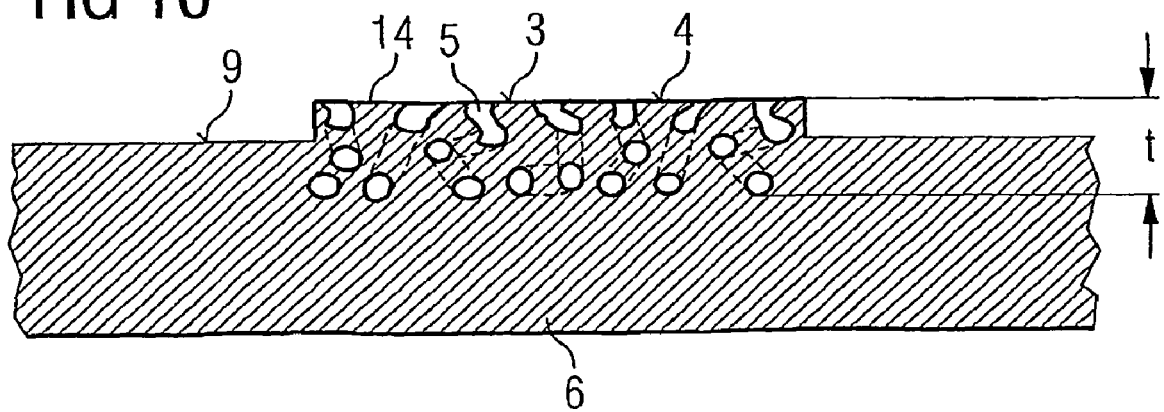

FIGS. 8 to 10 show schematic cross sections through part of a metal article after method steps for producing a surface portion with nanopores. FIG. 8 shows a cross section through a pore-free solid metal core 6, which is covered on its smooth upper side 3 by a mask 13. As a result, only a surface portion 14 is oxidized.

FIG. 9 shows the cross section through the metal article after the oxidation and after removal of the mask 13. In this case, an elevation is created in the surface portion 14 on account of the oxidation and the increase in volume of the metal oxide with respect to the metal core 6.

FIG. 10 shows the metal article after reduction of the oxide layer generated in FIG. 9, the elevation being retained, but the reduced metal structure that is created having nanopores 5. This surface portion with nanopores 5 is suitable for mechanically connecting the metal article at this location, for example, of an external contact area of a metal structure, to a further material, such as an external contact or solder ball.

Figure 11:
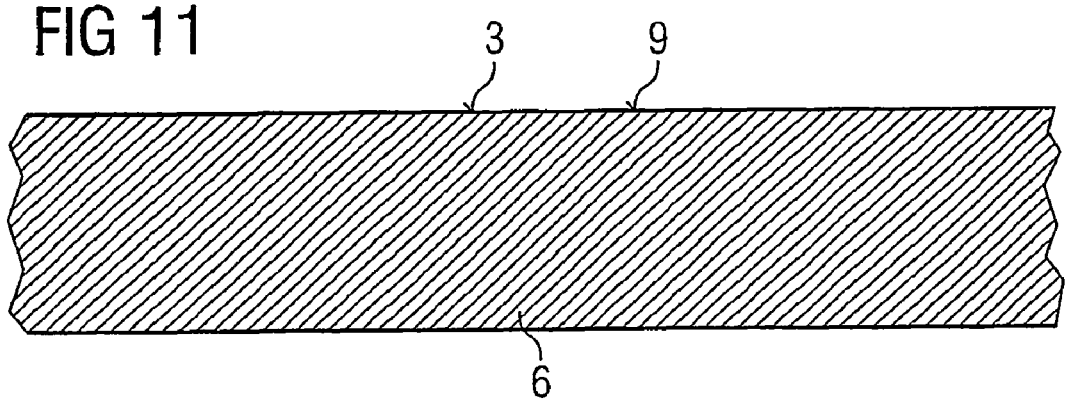
FIGS. 11 to 13 show schematic cross sections through part of a metal article after method steps for producing a surface portion with nanopores, surrounded by a pore-free metal oxide layer, in a metal matrix.
Figure 12:
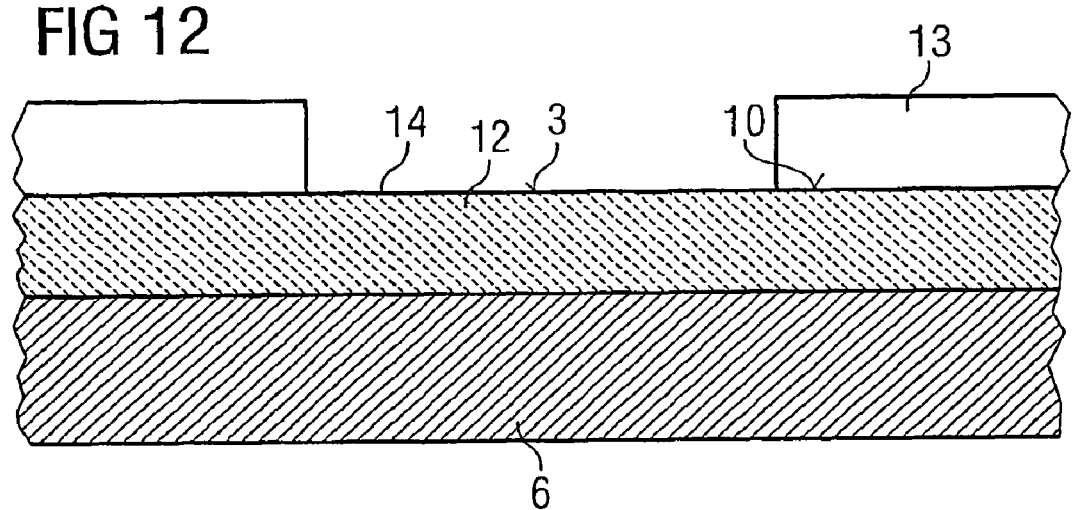
Figure 13:
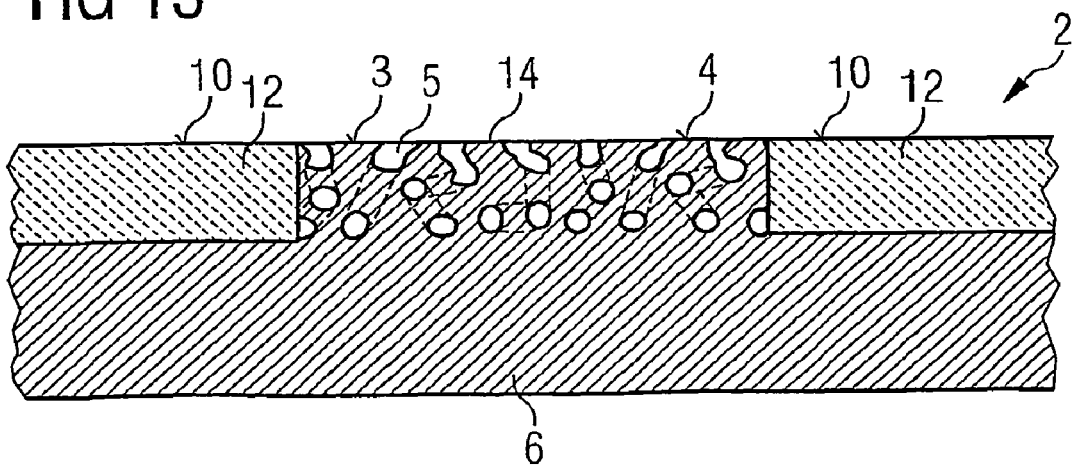

FIGS. 11 to 13 show schematic cross sections through part of a metal article after method steps for producing a surface portion with nanopores, surrounded by a pore-free metal oxide layer, in a metal matrix. FIG. 11 shows a schematic cross section through part of a metal article. This metal article with a metal core 6 has a macroscopically smooth surface 3, which forms a still pore-free metal surface 9.

FIG. 12 shows a schematic cross section through part of a metal article after oxidation of its entire surface. In this case, a metal oxide layer 12, which covers a pore-free metal core 6, is created. This metal oxide layer is partially covered by a mask 13. As a result, only the surface region 14 can be reduced.

FIG. 13 shows the reduced region which is kept free by the metal mask 13 shown in FIG. 12. FIG. 13 shows the result of the reduction after the mask 13 has been removed. A metal article prepared in this way comprises isolating areas in the form of metal oxide areas 12 and surface portions 14, which are conductive and have nanopores. As a result, a further substance can be mechanically connected to this area. A structure of this type is particularly suitable for applying external contacts in the form of solder balls, since a solder resist layer is automatically realized by the surrounding metal oxide layer 12. An ideal anchoring of the solder ball with the external contact area is in the region of the nanopores.

FIGS. 14 to 16 show schematic cross sections through part of a metal article after producing an isolated surface portion with nanopores in a metal matrix. FIG. 14 shows a schematic cross section through part of a metal article. This metal article has a macroscopically smooth surface 3, which forms a pore-free metal surface 9.

FIG. 15 again shows a schematic cross section through part of a metal article after oxidation of its entire surface. In this case, a metal oxide layer 12, which covers a pore-free metal core 6, is created. This metal oxide layer is subsequently covered by a mask 13, which keeps a surface portion 14 free for a reduction.

FIG. 16 shows a schematic cross section through part of a metal article after the reduction of the surface portion 14. In this example, the reduction was stopped prematurely. As a result, a metal layer region with nanopores, which is surrounded by a metal oxide layer 12 and is similarly isolated from the solid metal core 6 by a buried metal oxide layer 8, is created. This structure produces a metal structure in a metal oxide which has the same metal material as the solid metal core 6.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method for producing a metal article for at least partial mechanical connection to a substance, the method comprising:
   at least partially oxidizing the metal article, including forming a metal oxide layer on a surface portion of the metal article;
   reducing at least a portion of the metal oxide layer to form a metal layer along a surface of the metal article, the metal layer having a porous structure with open nanopores that open out from the surface of the metal article; and
   mechanically connecting the surface portion of the metal article having the porous structure to a substance comprising a connecting, supporting, or conducting component for an electronic component.

2. The method of claim 1, wherein, in the reducing of the metal oxide layer, the metal oxide layer is not completely reduced and a buried metal oxide layer remains.

3. The method of claim 1, wherein, in reducing the metal oxide layer, the metal oxide layer is reduced only in restricted surface regions.

4. The method of claim 1, wherein the oxidation is a dry oxidation that occurs in an oxygen-containing dry atmosphere with an oxygen content of 20 to 100% by volume.

5. The method of claim 1, wherein the oxidation is a wet oxidation that occurs in a wet oxygen-containing atmosphere, the relative humidity being between 60 and 95%, the oxygen content being 20 to 98% by volume.

6. The method of claim 4, wherein the metal article is a copper article or an article of a copper alloy and the dry oxidation of the metal article is at temperatures between 300 and 600° C. for 10 to 20 minutes.

7. The method of claim 5, wherein the metal article is a copper article or an article of a copper alloy and the wet oxidation of the metal article is at temperatures between 300 and 500° C. for 5 to 10 minutes.

8. A method for producing a metal article of a chromium/nickel/iron alloy for at least partial mechanical connection to a substance, the method comprising:
   at least partially oxidizing the metal article, including forming a metal oxide layer on a surface portion of the metal article, wherein oxidation of a metal article of a chromium/nickel/iron alloy is at temperatures between 500° C. and 900° C.;
   reducing the metal oxide layer to a porous structure with open nanopores that open out from the surface portion; and
   mechanically connecting the surface portion of the metal article having the porous structure to a substance comprising a connecting, supporting, or conducting component for an electronic component.

9. The method of claim 1, wherein the oxidation includes growing an oxide layer between 0.1 and 10 micrometers thick on the metal article.

10. The method of claim 1, wherein the reduction is in a hydrogen-containing atmosphere.

11. The method of claim 1, wherein the reduction is at temperatures between 300° C. and 500° C.

12. The method of claim 1, wherein the reduction is in a reducing atmosphere, which comprises diamine.

13. The method of claim 1, wherein the reduction is in a reducing atmosphere, which comprises forming gas.

14. The method of claim 1, wherein the reduction is in a reducing atmosphere, which comprises hydrazine or formaldehyde.

15. A method for producing a metal article for at least partial mechanical connection to a substance, the method comprising:
   at least partially oxidizing the metal article, including forming a metal oxide layer on a surface portion of the metal article;
   reducing the metal oxide layer to a porous structure with open nanopores that open out from the surface portion, wherein oxidation and reduction are carried out repeatedly in succession; and
   mechanically connecting the surface portion of the metal article having the porous structure to a substance comprising a connecting, supporting, or conducting component for an electronic component.

16. A method for producing a metal article for at least partial mechanical connection to a substance, the method comprising:
   at least partially oxidizing the metal article, including forming a metal oxide layer on a surface portion of the metal article; and
   reducing the metal oxide layer to a porous structure with open nanopores that open out from the surface portion, wherein the substance to be mechanically connected includes at least one of a glass, a ceramic and a plastic.

17. The method of claim 1, wherein the nanopores have an average diameter between 10 nm to 300 nm.

18. A method for producing a metal article for at least partial mechanical connection to a substance, the method comprising:
   at least partially oxidizing the metal article, including forming a metal oxide layer on a surface portion of the metal article;
   reducing the metal oxide layer to a porous structure with open nanopores that open out from the surface portion, wherein the nanopores extend from the surface to a depth between 0.1 μm to 10 μm; and
   mechanically connecting the surface portion of the metal article having the porous structure to a substance comprising a connecting, supporting, or conducting component for an electronic component.

* * * * *